(12) United States Patent
Birner et al.

(10) Patent No.: US 6,878,600 B2
(45) Date of Patent: Apr. 12, 2005

(54) METHOD FOR FABRICATING TRENCH CAPACITORS AND SEMICONDUCTOR DEVICE WITH TRENCH CAPACITORS

(75) Inventors: Albert Birner, Dresden (DE); Matthias Goldbach, Dresden (DE); Martin Franosch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/436,426

(22) Filed: May 12, 2003

(65) Prior Publication Data

US 2003/0201479 A1 Oct. 30, 2003

Related U.S. Application Data

(63) Continuation of application No. PCT/EP01/12733, filed on Nov. 2, 2001.

(30) Foreign Application Priority Data

Nov. 10, 2000 (DE) .......................................... 100 55 711

(51) Int. Cl.[7] ..................... H01L 21/20; H01L 21/8242; H01L 27/108
(52) U.S. Cl. ..................... 438/386; 438/243; 438/248; 438/255; 438/387; 438/389; 438/392; 257/301; 257/309
(58) Field of Search ............................... 438/243, 248, 438/255, 386, 960, 396–398, 387, 389, 392; 257/301, 309

(56) References Cited

U.S. PATENT DOCUMENTS

| | | | |
|---|---|---|---|
| 5,209,833 A | | 5/1993 | Föll et al. |
| 5,635,419 A | * | 6/1997 | Geiss et al. .................. 438/386 |
| 5,739,565 A | * | 4/1998 | Nakamura et al. .......... 257/301 |
| 5,981,350 A | | 11/1999 | Geusic et al. |
| 6,025,225 A | | 2/2000 | Forbes et al. |

FOREIGN PATENT DOCUMENTS

| | | |
|---|---|---|
| DE | 199 40 825 A1 | 4/2001 |
| EP | 0 400 387 B1 | 12/1990 |
| EP | 0903782 * | 8/1998 |
| EP | 0 903 782 A2 | 3/1999 |
| WO | 99/25026 | 5/1999 |

* cited by examiner

Primary Examiner—Donghee Kang
(74) Attorney, Agent, or Firm—Laurence A. Greenberg; Werner H. Stemer; Ralph E. Locher

(57) ABSTRACT

A method for fabricating trench capacitors having trenches with mesopores, the trench capacitors being suitable both for discrete capacitors and for integrated semiconductor memories, significantly increases the surface area for electrodes of the capacitors and, hence, the capacitance thereof. The mesopores, which are small woodworm-hole-like channels having diameters from approximately 2 to 50 nm, are fabricated electrochemically. It is, thus, possible to produce capacitances with a large capacitance-to-volume ratio. Growth of the mesopores stops, at the latest, when the mesopores reach a minimum distance from another mesopore or adjacent trench (self-passivation). As such, the formation of "short circuits" between two adjacent mesopores can be avoided in a self-regulated manner. Furthermore, a semiconductor device is provided including at least one trench capacitor on the front side of a semiconductor substrate fabricated by the method according to the invention.

33 Claims, 14 Drawing Sheets

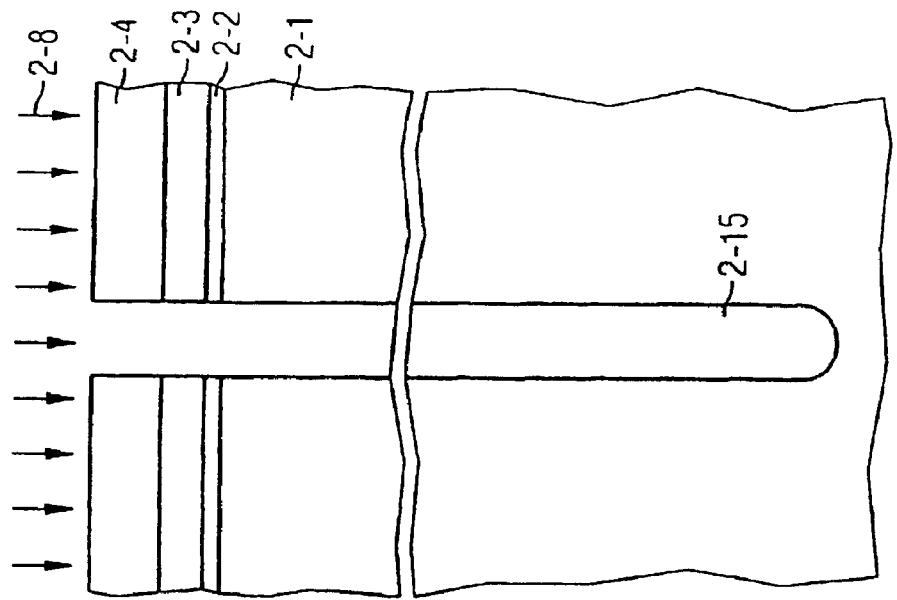
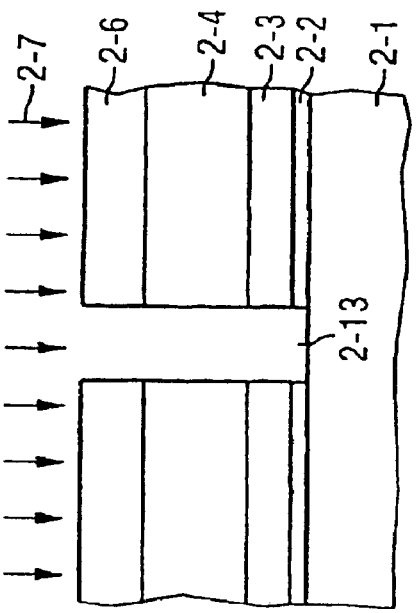
FIG. 2A Prior Art
FIG. 2B Prior Art

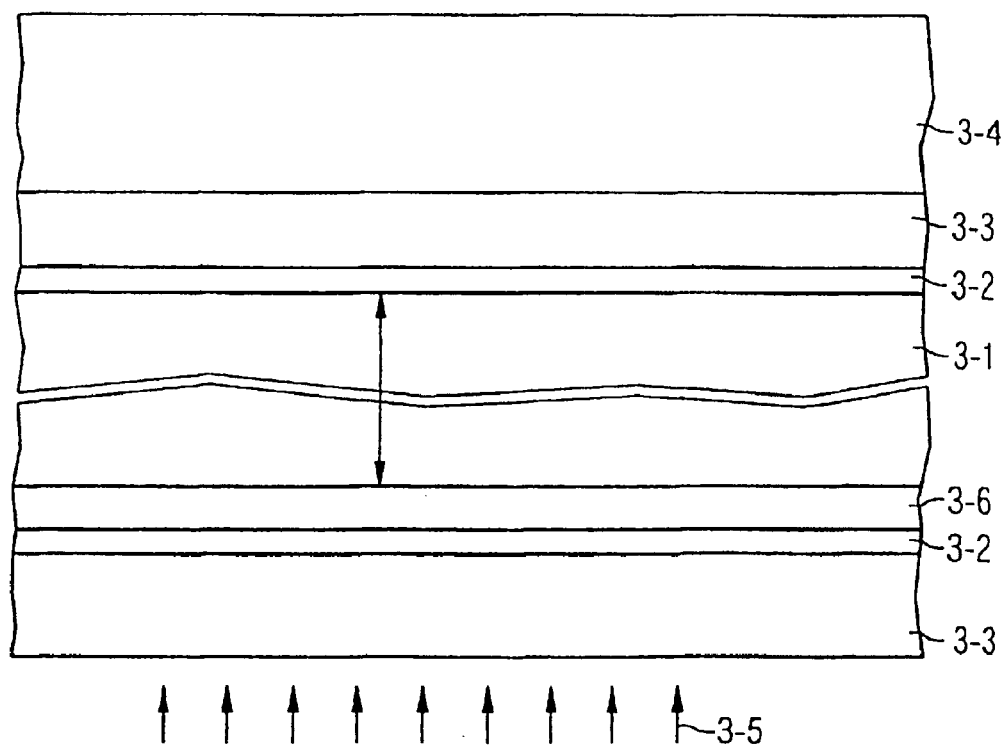

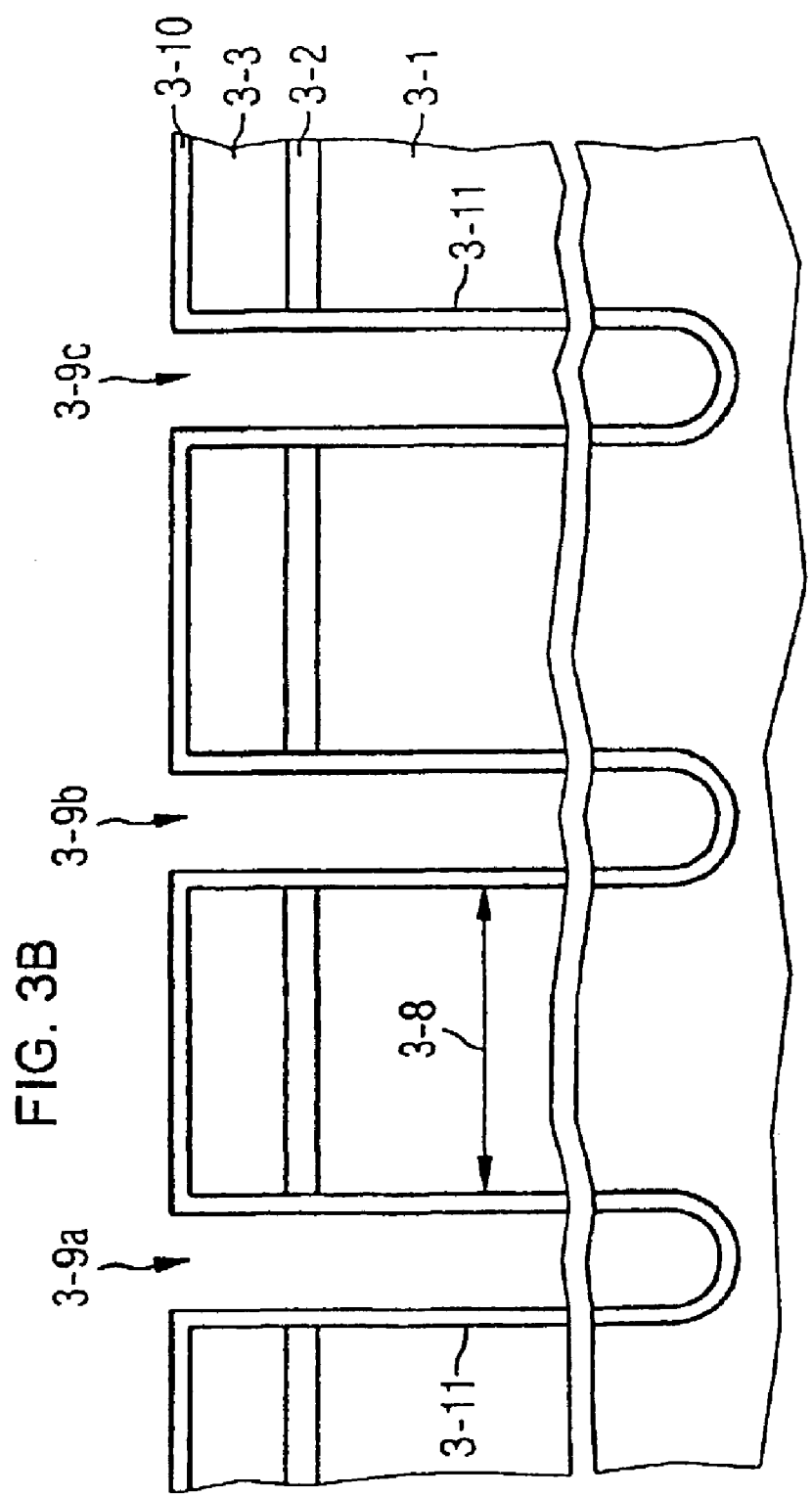

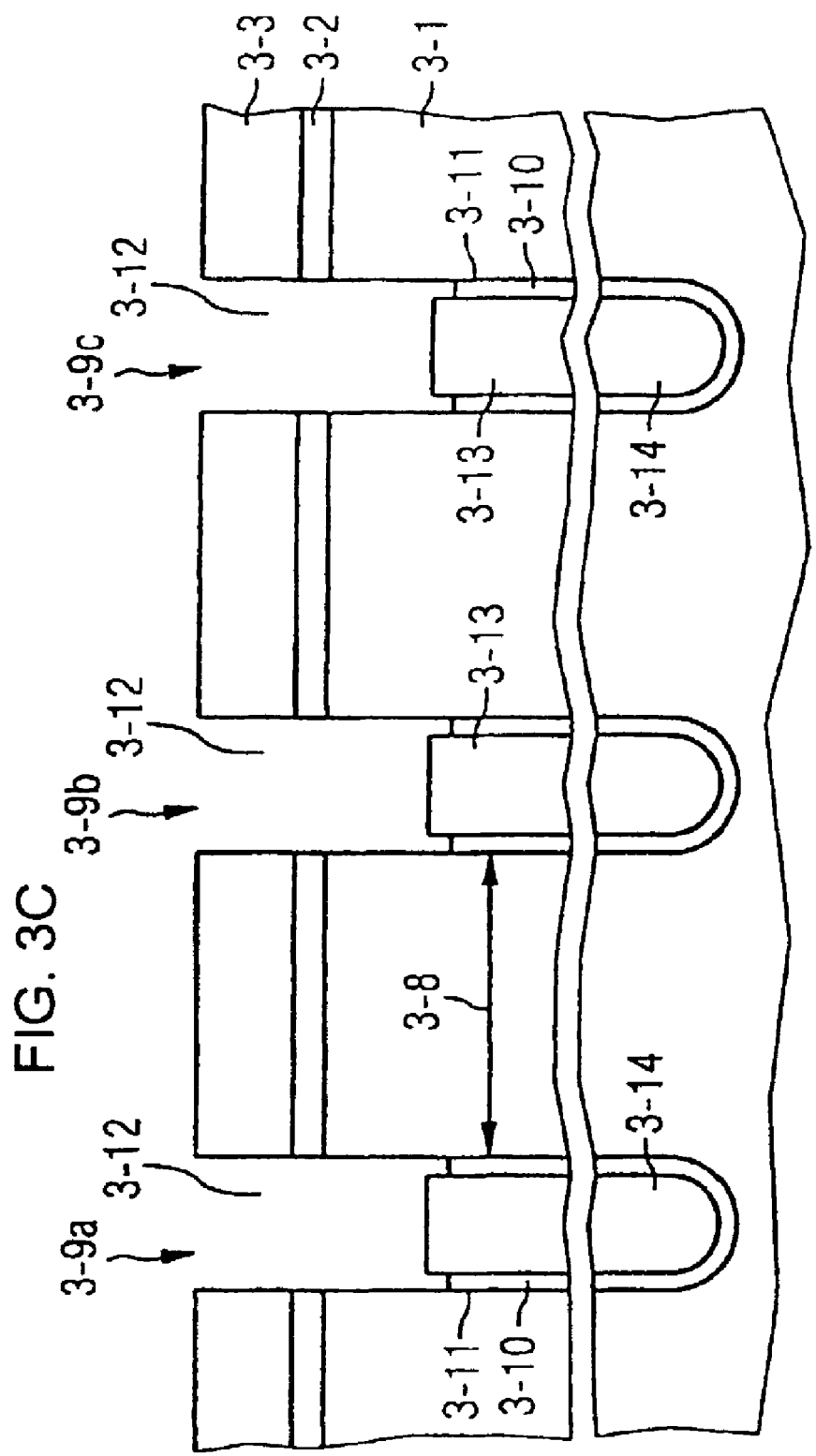

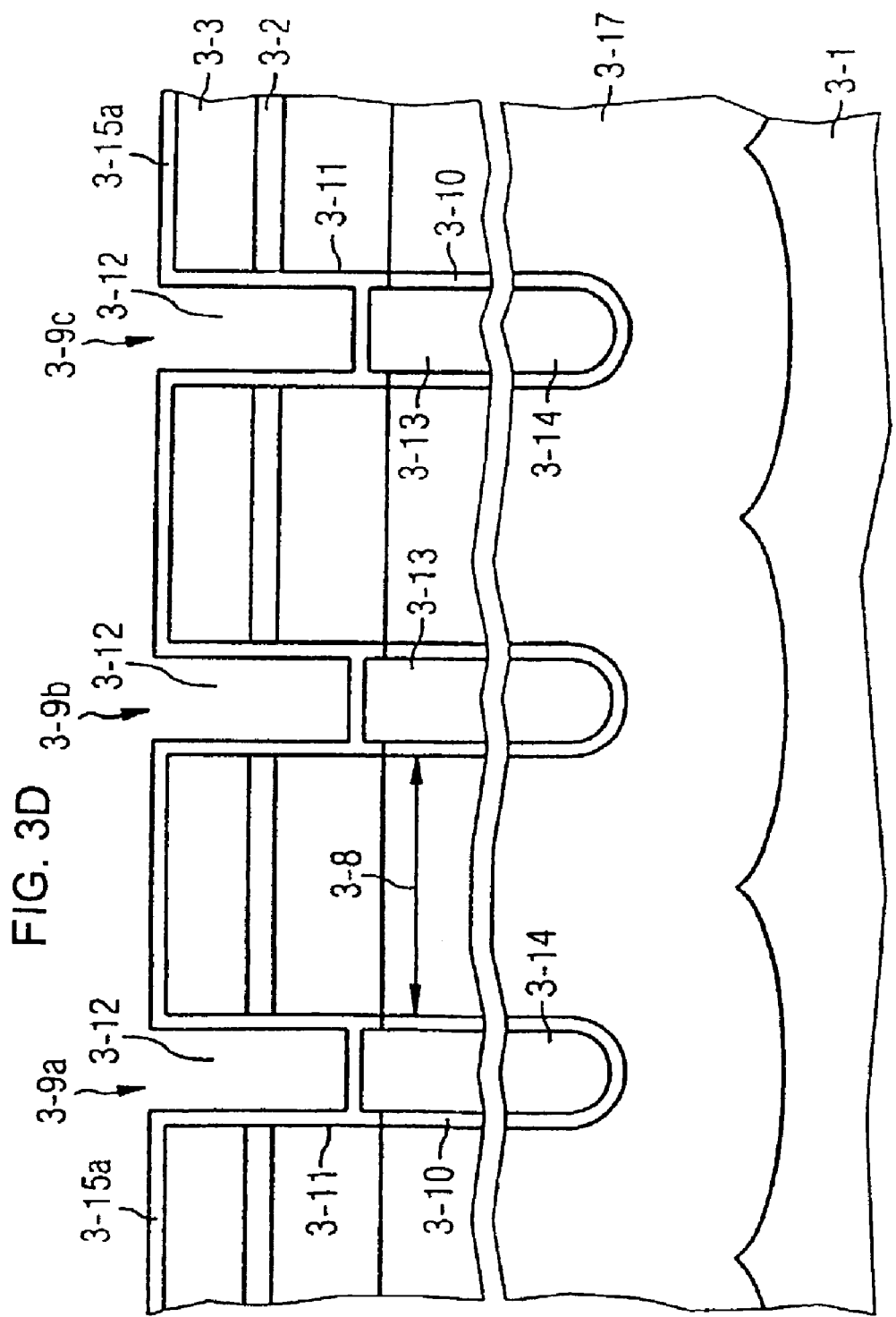

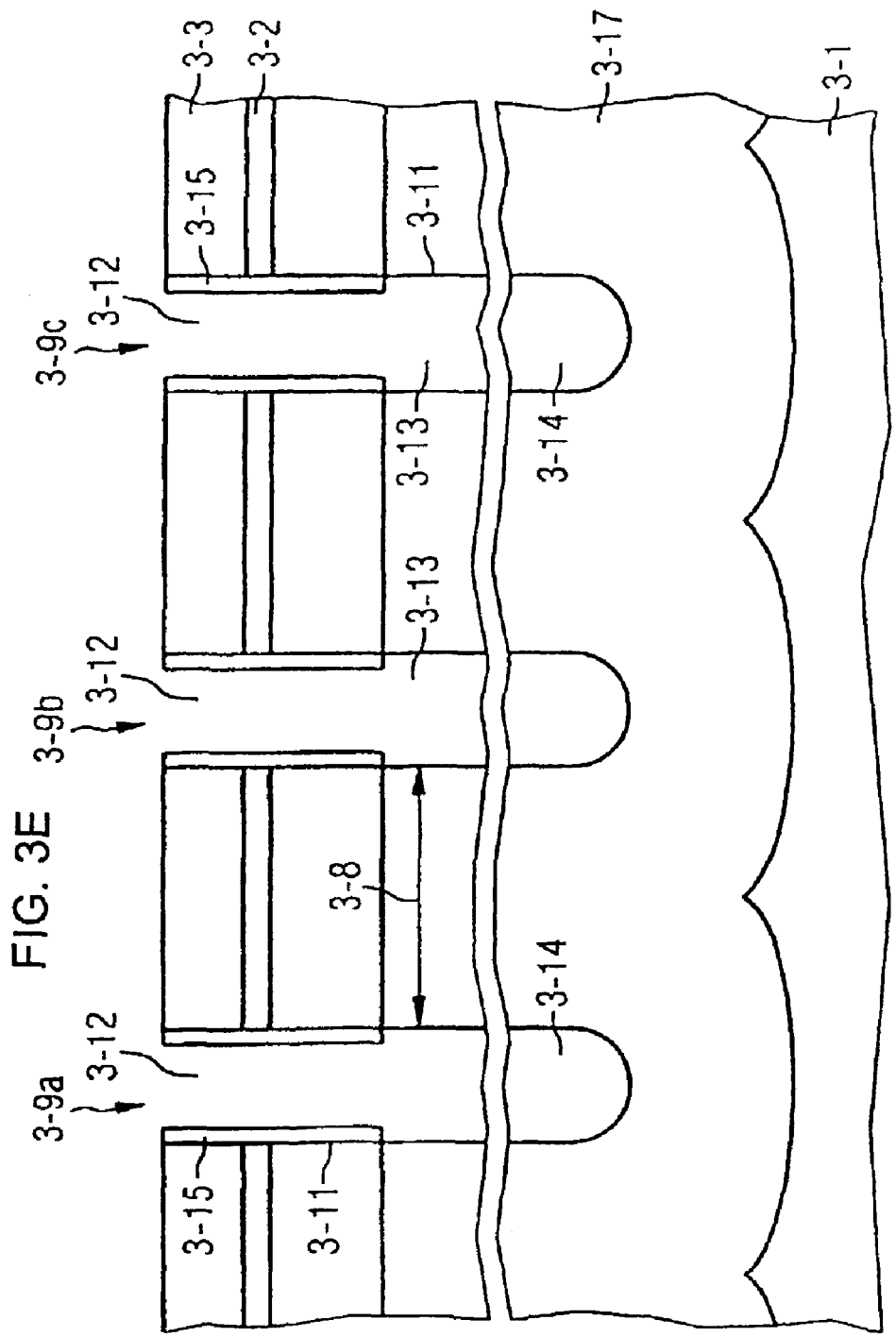

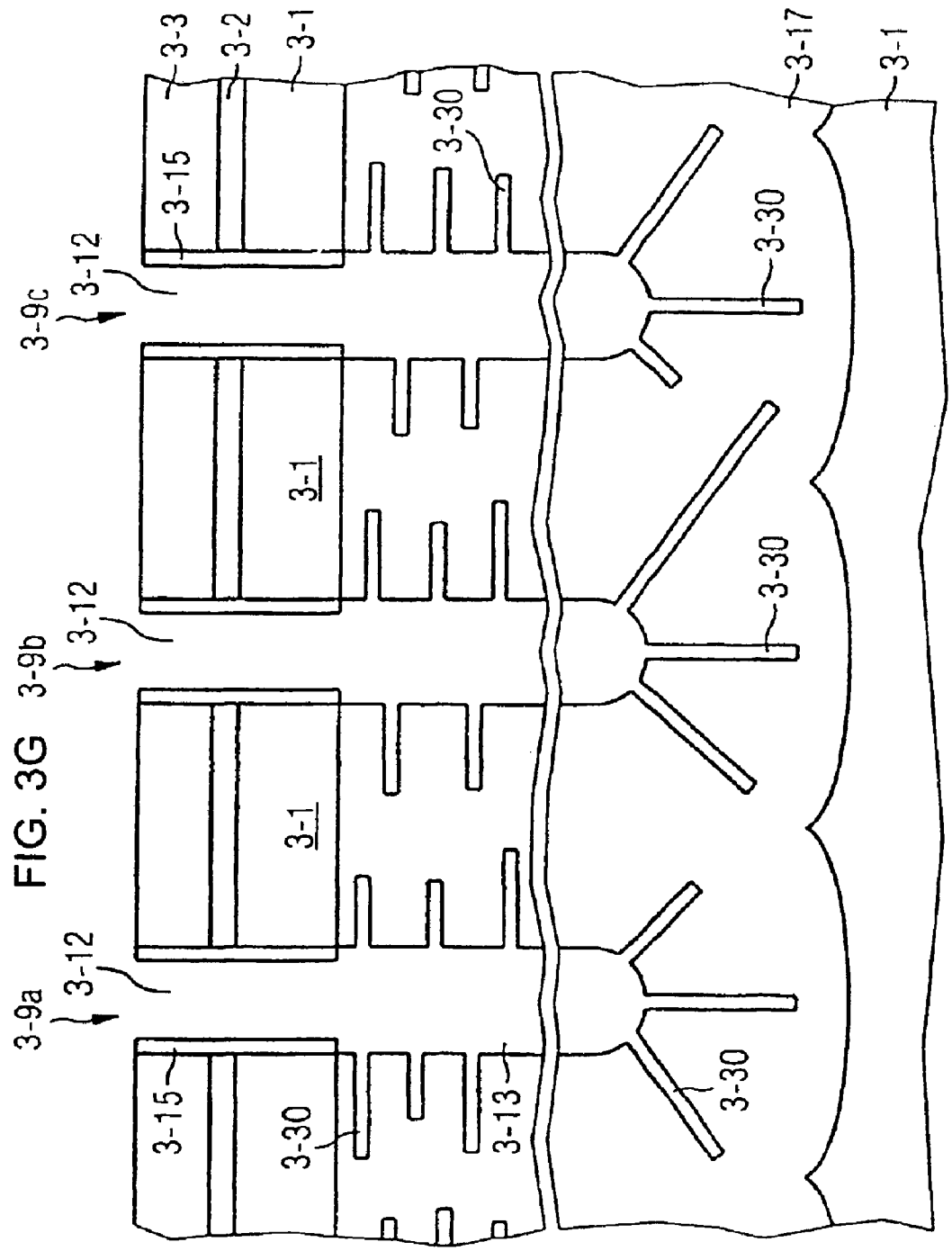

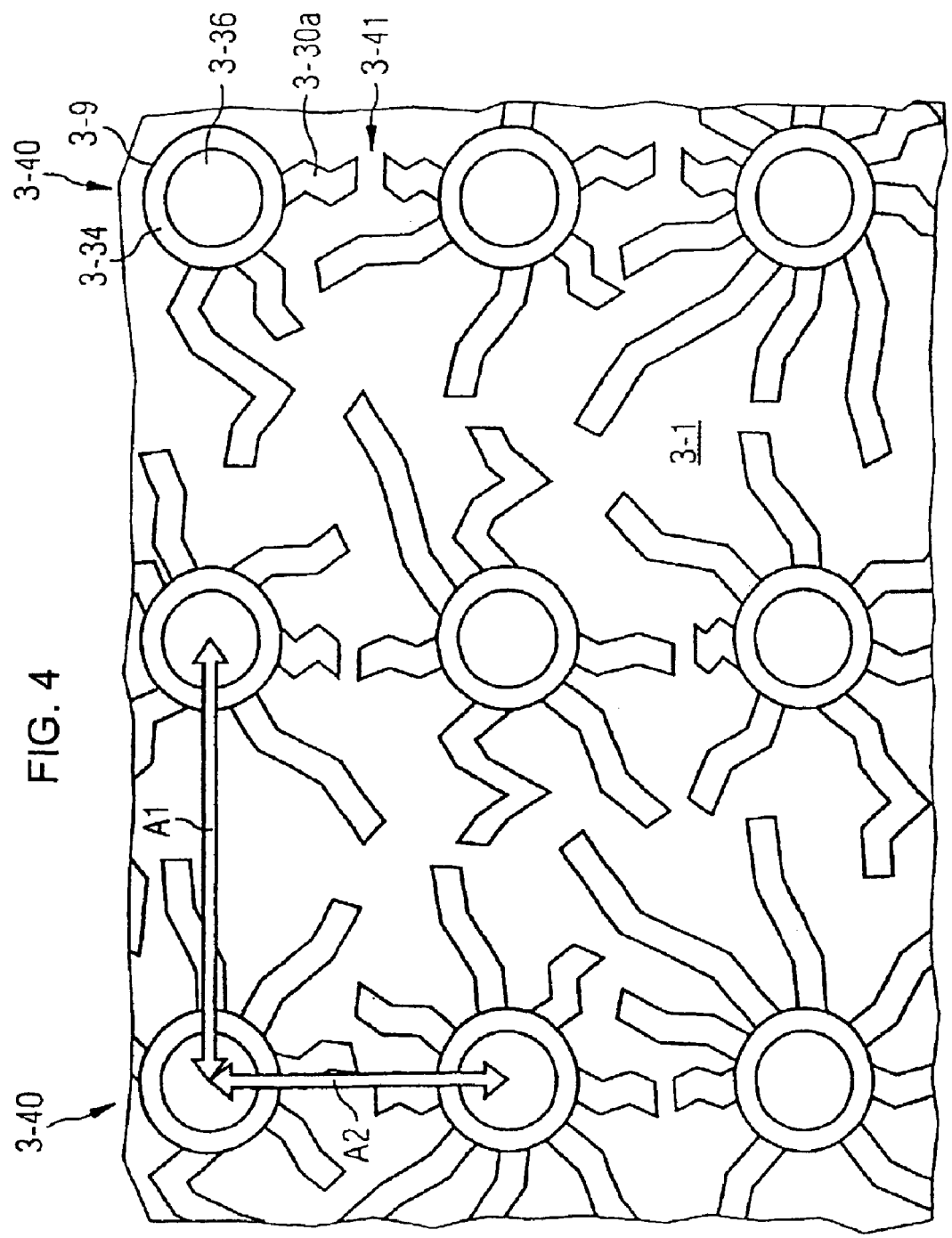

METHOD FOR FABRICATING TRENCH CAPACITORS AND SEMICONDUCTOR DEVICE WITH TRENCH CAPACITORS

CROSS-REFERENCE TO RELATED APPLICATION

This application is a continuation of copending International Application No. PCT/EP01/12733, filed Nov. 2, 2001, which designated the United States and was not published in English.

BACKGROUND OF THE INVENTION

Field of the Invention

The invention relates to a method for fabricating trench capacitors both for discrete capacitors and for integrated devices and, in particular, for integrated semiconductor memories, and a semiconductor device with trench capacitors.

The increasing miniaturization of electronic circuit elements leads to the demand for capacitors having the largest possible capacitance-to-volume ratio. In addition to reducing the thickness of the dielectric layers between the two capacitor electrodes and increasing the dielectric constants by the choice of new materials, in particular, enlarging the surfaces of the capacitor electrodes in a predetermined volume leads to a larger capacitance-to-volume ratio.

The action of enlarging surfaces for a predetermined volume can be achieved, e.g., by roughening or by the finest possible patterning of the surfaces of a substrate on which the electrodes and the dielectric layers are applied.

A technique for fabricating capacitors with a large capacitance-to-volume ratio that has proved successful in the meantime involves producing capacitors in trenches that are produced in the substrate and that are coated by a first electrode, a dielectric layer, and a second electrode. This technique is employed both for the fabrication of capacitances in very large scale integrated devices, which demand a minimization of the area requirement on the substrate for a predetermined minimum capacitance, and for the fabrication of discrete capacitors, which demand a maximization of the capacitance for a predetermined volume.

An embodiment of discrete trench capacitors is described in German Published, Non-Prosecuted Patent Application 19940825.4-33 entitled "Capacitor structure." For the purpose of increasing the capacitance, this capacitor structure has a multiplicity of trenches in a silicon substrate, which are all coated with an electrode, a dielectric layer, and a second electrode and, thus, together, form a capacitor. FIG. 1 shows an embodiment of such a trench capacitor on an n-doped silicon substrate 1-1, which has trenches 1-2 having a trench depth of about 100–250 $\mu$m and a trench hole width of 0.5–3 $\mu$m. The silicon substrate 1-1 simultaneously serves as first electrode. Furthermore, an insulation layer 1-3, which serves as dielectric, and a second electrode 1-4 are incorporated into the trenches 1-2. The contact layer 1-6 serves for making contact with the second electrode 1-4. The capacitance of the capacitor is, thus, composed substantially of the sum of the capacitance produced in each trench.

In contrast to this, the trench capacitors of a large-scale integrated memory device usually have one trench per trench capacitor. In this device, at least one of the two electrodes must be patterned such that the electrodes of adjacent trenches are not electrically connected to one another. So that the charge stored in a storage capacitor of a memory cell can be read out in a reproducible manner, the capacitance of the storage capacitor should have at least a value of about 30 fF. At the same time, the lateral extent of the capacitor must be as small as possible.

The fabrication of trench capacitors for DRAM semiconductor memories according to the prior art is described diagrammatically in FIGS. 2A to 2D. In a first step (FIG. 2A), a thin oxide layer 2-2, which functions as a pad oxide, a nitride layer 2-3, and a further oxide layer 2-4 are applied to a p-doped silicon wafer 2-1. Furthermore, a photoresist mask layer 2-6 is applied to the oxide layer 2-4 and patterned photolithographically such that the openings of the photoresist mask 2-6 reproduce the position and cross-section of the trenches to be etched. In such a case, the mask openings 2-13 typically have an oval or virtually round or square cross-section so that, in practice, as seen from above, they are largely perceived as holes. FIG. 2A shows the structure after the layer stack including pad oxide 2-2, nitride layer 2-3, and oxide layer 2-4 has been patterned at the patterned photoresist mask 2-6 in an anisotropic etching step, preferably, using a first dry etching gas 2-7. A hard mask has, thus, been fabricated that can be used to etch the trenches into the p-doped silicon wafer 2-1. The photoresist layer 2-6 is removed after this patterning process.

The trenches 2-15 are etched substantially selectively with respect to the oxide layer 2-4 in an anisotropic dry etching step, e.g., by an RIE etching step using a second dry etching gas 2-8 (FIG. 2B). Afterwards, the oxide layer 2-4 is removed again.

In a further step, the inner walls of the trenches 2-15 are n-doped so that, insulated from the p-doped region surrounding them, they can serve as first electrode 2-10 ("buried plate") for the capacitors to be produced. The n-type doping of the inner walls of the trenches is effected, e.g., by the deposition of an arsenosilicate glass layer on the inner walls of the trenches 2-15. A subsequent diffusion step causes the arsenic of the arsenosilicate glass to penetrate into the sidewall and produce an n-doped layer that completely surrounds the trenches. The n-doped layers surrounding the trenches constitute the first electrode 2-10 (n-buried plate) for the trench capacitors. The arsenosilicate glass layer is, subsequently, removed again (FIG. 2C).

The following, then, takes place: an n-type implantation for short-circuiting adjacent first electrodes 2-10 (not shown in FIG. 2D), the deposition of a dielectric 2-11, e.g., an oxide-nitride-oxide (ONO) layer, on the first electrode 2-10 and the deposition of an n-doped polysilicon layer that serves as second electrode 2-12. As a result of a subsequent chemical mechanical polishing (CMP) step, the dielectric 2-11 and the polysilicon layer constituting the second electrode 2-12 remain only in the trenches (FIG. 2D). The fabrication of the trench capacitors is, thus, largely concluded.

At the present time, trench capacitors for DRAMs are routinely fabricated with a trench diameter at the substrate surface of about 300 nm and a depth of up to 10 $\mu$m, in order to be able to provide an adequate trench wall surface for the electrodes. However, the fabrication of trenches with such a high depth/cross-section aspect ratio imposes stringent requirements on the etching step and, accordingly, is lengthy and expensive. Further reduction of the trench diameters with increasing trench depth to enlarge the trench wall area is becoming more and more difficult.

Any further increase in the capacitance-to-volume ratios of discrete or integrated trench capacitors by densification or deepening of trenches will rapidly encounter technological or cost limits. As an alternative method for increasing the trench wall surface area, surface-enlarging methods such as the roughening of the trench wall surface (see, e.g., the specifications of U.S. Pat. No. 5,981,350 to Geusic et al. or U.S. Pat No. 6,025,225 to Forbes et al.) or the widening of the trench cross-section with a larger trench depth have been developed (bottle-shaped trenches). In both methods, however, care must be taken to ensure that the widening of the trenches is not carried out too far so that the intermediate walls between adjacent trenches are not destroyed because this would, again, reduce the surface areas. In semiconductor memories, destruction of the intermediate walls would even lead to short circuits between adjacent trench capacitors. In such a case, therefore, it is necessary to comply with a safety distance between the trenches, which is an obstacle to the greatest possible widening of the trench cross-sections. Increasing the trench wall surface area is, therefore, limited using these methods.

SUMMARY OF THE INVENTION

It is accordingly an object of the invention to provide a method for fabricating trench capacitors and a semiconductor device with trench capacitors that overcome the hereinafore-mentioned disadvantages of the heretofore-known devices and methods of this general type and that does not have the difficulties discussed above and significantly increases the trench wall surface area in a cost-effective manner without arising the risk of destruction of the intermediate walls between adjacent trenches. For semiconductor memories, the invention, in particular, substantially prevents the formation of short circuits between adjacent trench capacitors.

With the foregoing and other objects in view, there is provided, in accordance with the invention, a method for fabricating at least one trench capacitor having the following steps:
  a semiconductor substrate having one or a plurality of trenches on the front side of a semiconductor substrate is provided, the trenches having a predetermined n-type doping at the trench wall surface;
  a liquid electrolyte is applied to the front side of the semiconductor substrate;
  an electrical voltage between the rear side of the semiconductor substrate and the liquid electrolyte is applied, with the result that an electric current having a predetermined current density flows and mesopores are produced in the trench wall;
  a first electrode is produced in the trench and the associated mesopores;
  a dielectric is applied to the first electrode; and
  a second electrode is applied to the dielectric.

The predetermined current density can be less than 50 mA/cm$^2$. The n-type doping and the current density can be chosen to provide a thickness of space charge zones at sides of the mesopores to be approximately 10 to 50 nm.

With the objects of the invention in view, there is also provided a semiconductor device having at least one trench capacitor on the front side of a semiconductor substrate, wherein:
  the trench capacitor has at least one trench in the semiconductor substrate with mesopores in the trench wall;
  the trench wall and the walls of the mesopores of the trench capacitor have a first electrode or a first electrode is applied on the trench wall and on the walls of the mesopores of the trench capacitor;
  a dielectric is applied on the first electrode of the trench capacitor; and
  a second electrode is applied on the dielectric of the trench capacitor.

The trench wall can have an n-doped region and the mesopores can be disposed in the n-doped region. Mesopores of adjacent ones of the trenches do not touch one another.

With the method according to the invention, mesopores are produced in the trench wall, which mesopores, given a sufficient number, sufficient length, and sufficient diameter, significantly increase the total surface area of a trench and, thus, the total surface area of the electrodes of a trench capacitor.

Mesopores are electrochemically-fabricated channels in a semiconductor substrate with a definition-conforming pore diameter of between 2 nm and 50 nm. The mesopores, preferably, arrive at n-doped surfaces of the semiconductor substrate that come into contact with the electrolyte according to the invention under a suitable electrical voltage. In particular, the mesopores, preferably, arrive at the n-doped regions of the trench wall surfaces and grow as "woodworm-hole-like" channels from the trench wall surface into the n-doped trench wall interior. In such a case, the trench wall interior is the semiconductor substrate material directly surrounding the trench.

The trench or trenches, at whose trench wall surfaces the mesopores are produced, is or are produced on the front side of the semiconductor substrate. The trenches serve for providing a largest possible surface for accommodating trench capacitors with the large possible capacitance in conjunction with a minimal area requirement on the semiconductor substrate. According to the invention, the trenches simultaneously have the trench wall surfaces on which the mesopores are produced. To enable the formation of mesopores, the trench walls of the trenches are provided with a predetermined n-type doping.

The mesopores are formed electrochemically. The method according to the invention uses electrochemical processes at the interface between the liquid electrolyte and the n-doped surfaces of the semiconductor substrate to the effect that, when an external electrical voltage is applied between the rear side of the semiconductor substrate and the liquid electrolyte, semiconductor substrate material of n-doped surfaces is etched at those locations that are distinguished by a topology-dictated local elevation of the electric field.

In such a case, the invention utilizes the etching selectivity that is established during the electrochemical etching and that prefers the etching at the mesopore tips while other regions of the interface remain unetched. This selectivity may, but not necessarily, results from the electric field profile and the formation of space charge zones on the uneven interfaces when the external electrical voltage is applied. The unevennesses of the interface between the liquid electrolyte and the semiconductor substrate produce regions having a different field strength. Pointed depressions in the trench wall produce, e.g., a strong field, whereby the etching operation is accelerated. Because the space charge zones simultaneously effect passivation at the sides of the depressions, the depressions grow to form mesopores running in a "woodworm-hole-like" manner. The diameter of these mesopores typically lies in the range of between 2 nm and 20 nm, in which case the exact diameter can be set by the n-type doping concentration and the current density.

The passivation at the sides of the mesopores by the space charge zones also limits the mesopore density because the smallest distance between two mesopores is given to a good approximation by the extents of the two space charge zones.

Because the extent of the space charge zones is determined both by the n-type doping concentration at the trench walls and by the electric field, the density of the mesopores can be set by these two parameters.

The electrical voltage between the rear side of the semiconductor substrate and the liquid electrolyte serves for producing a selective etching at the trench walls. The electrical voltage is, preferably, applied to the rear side such that, in the area region of the mesopores to be etched, the rear side is put at a homogeneous electrical potential, i.e., the corresponding rear-side regions are, preferably, in contact with one another in a low-impedance manner. This results, at the rear-side area, in a homogeneous current density distribution perpendicular to the rear-side area. As such, the trenches, to a first order, "see" the same electric field distribution so that the mesopores at the different trenches can form under largely identical conditions.

Furthermore, a first electrode is produced in each case in a trench and the associated mesopores. In accordance with another feature of the invention, the first electrode is produced on the surfaces of the trench and the associated mesopores. In such a case, the first electrode is, preferably, applied as a conductive layer to the surfaces of the trench and the associated mesopores. Preferably, an n-type doping step is carried out to complete the first electrode of a trench capacitor.

In accordance with a further feature of the invention, the first electrode is given by n-doped regions of the trench walls. In this case, the n-type doping of the first electrode may be given by the n-type doping required for producing the mesopores or by an additional n-type doping step. Further, in this case, the n-type doping is, preferably, carried out down to a depth such that a low-impedance electrical connection is produced between the trench wall surfaces of adjacent trenches. As such, the first electrodes of the trench capacitors are connected to one another in a low-impedance manner and can be put at a common potential. The n-type doping may be interpreted as a conductive layer ("buried plate") in this case.

Furthermore, a dielectric is applied in each case to the first electrode. The dielectric covers the first electrode, preferably, in a wide region in order to obtain a large surface for a largest possible capacitance. Finally, a second electrode is in each case applied to the dielectric and, preferably, likewise largely covers the dielectric.

The dielectric determines the capacitance of the trench capacitor by virtue of the dielectric constant of its material or materials, by virtue of the area with which it insulates the first electrode from the second electrode, and also by virtue of its thickness that defines the distance between the first electrode and the second electrode. To obtain a large capacitance, therefore, the dielectric is, preferably, applied as a thin layer to the first electrode.

Preferably, the trenches according to the invention have an oval or substantially round or square cross-section on the front side of the semiconductor substrate. Furthermore, the trenches, among one another, preferably, have substantially the same form, i.e., preferably, have approximately the same cross-sections and approximately the same depth (<20% fluctuation with regard to the depth). The trenches are, preferably, produced by an etching step and, preferably, by an etching at a mask, which, thus, determines the configuration of the trenches. In accordance with an added feature of the invention, however, the trenches can also be produced electrolytically as macropores (for further details, see, in this respect, co-pending U.S. patent application Ser. No. 10/436,427 titled "Method for Fabricating Trench Capacitors for Large Scale Integrated Semiconductor Memories," filed on May 12, 2003, which is hereby incorporated herein by reference).

The trenches are, preferably, disposed in a regular two-dimensional structure. In semiconductor memories, the structure is, preferably, produced from the layout of the memory cells, which are intended to be packed as densely as possible, it being necessary to take account of the space requirement for memory cell components (transistor and trench) and for leads on the front side of the semiconductor substrate. In particular, the trenches are disposed there individually or, preferably, as trench pairs, trench triplets or other trench multiplets situated densely beside one another, such that the individual trenches or trench multiplets are, preferably, at a regular distance A1 from one another in one direction and a regular distance A2 from one another in another direction. Furthermore, the two directions are, preferably, disposed largely perpendicularly to one another. As such, it is possible to obtain a large packing density for the trench capacitors on the front side of the semiconductor substrate.

The trenches are, preferably, more than ten, and, preferably, also more than thirty, times as deep as the maximum diameter of the respective trench cross-section at the semiconductor substrate surface. The deeper the trench, the larger the trench wall surface and the larger the area for producing mesopores for a given trench cross-section for the production of a trench capacitor.

The surface of the semiconductor substrate is, preferably, covered with a horizontal electrically insulating covering layer in the regions between the trenches during the applied electrical voltage. The horizontal electrically insulating covering layer prevents the liquid electrolyte from touching the surface of the semiconductor substrate. On one hand, this prevents mesopores from also forming at the surface of the semiconductor substrate during the electrochemical etching; on the other hand, however, this also prevents an elevated current from flowing, in particular, in regions with p-doped surfaces during the electrochemical etching, which current disturbs the formation of electric fields for mesopore formation and, thus, impedes mesopore formation in the trenches. The horizontal electrically insulating covering layer, preferably, has a nitride layer, in particular, also a nitride layer on an oxide layer.

The trenches, preferably, have in each case an upper trench region and a lower trench region, the trench wall surfaces of the upper trench regions being covered by vertical electrically insulating covering layers during the applied electrical voltage and the trench wall surfaces of the lower trench regions being free of coverings. The vertical electrically insulating covering layers prevent the liquid electrolyte from touching the semiconductor substrate and, thus, prevent the production of mesopores in the upper trench region. Furthermore, the vertical electrically insulating covering layers, preferably, cover p-doped surface regions and, thus, prevent an elevated current flow between the p-doped regions and the liquid electrolyte. The vertical electrically insulating covering layer is, preferably, a nitride layer and, preferably, also a nitride layer on an oxide layer. The vertical electrically insulating covering layer, preferably, covers the trench wall surface as far as the surface of the semiconductor substrate, with the result that only the trench wall surfaces of the lower trench region are not covered in the trenches. In such a case, the upper trench region reaches down to a depth of the trench of, preferably, more than 0.5 $\mu$m, preferably, less than 2 $\mu$m. A typical value for the depth to which the upper trench region reaches into the trench is 1 $\mu$m.

The production of the vertical electrically insulating covering layers is, preferably, effected in a plurality of steps. In a first step, the trenches are filled with a filling material, preferably, made of polysilicon, up to the level up to which the trench wall surface is intended not to be covered. This level defines the separating line between the upper and lower trench regions. In a second step, the surface of the semiconductor substrate and the surface of the trench walls are covered largely conformally with a covering layer, preferably, a nitride layer. The n-type doping is then, preferably, performed by the TEAS/TEOS oxide layer of the trench walls in the lower trench region by an annealing step. In a further step, the horizontally running regions of the covering layer are removed by a largely anisotropic etching step, leaving only the vertically running layer regions. Preferably, the filling material and the remaining TEAS/TEOS oxide layer portions are, subsequently, removed again.

The trench walls of the lower trench regions are, preferably, n-doped. The doping of the trench walls of the lower trench regions and the current density during the application of the voltage are, preferably, chosen such that a predetermined average mesopore density is produced. Current density and doping of the trench walls are used to define the extent of the passivated regions beside the mesopores or inverse surface tips and, hence, the average density of the mesopores at the trench walls. The n-type doping of the lower trench regions is, preferably, achieved by indiffusion of arsenic, phosphorus and/or antimony. In a preferred embodiment, the indiffusion is achieved by a layer that is produced by triethyl arsenate (TEAS or $AsO(OC_2H_5)_3$) and is brought to the trench walls, and by an annealing/drive-in step. In another preferred embodiment, the indiffusion is carried out by a gas phase deposition step.

In accordance with again a further feature of the invention, the mesopores of the trenches have an average mesopore diameter greater than approximately 5 nm and less than approximately 50 nm.

The predetermined current density is, preferably, produced by an electrical voltage between the rear side of the semiconductor substrate and a counter-electrode introduced in the liquid electrolyte. The surface of the rear side of the semiconductor substrate, preferably, has low impedance in the region in which mesopores are intended to be produced on the front side, with the result that the rear side is largely at the same electrical potential in this region. What is achieved, as a result, is that the current in this region flows largely perpendicularly and with largely the same current density through the rear side of the semiconductor substrate to the trenches.

In accordance with an additional feature of the invention, the electrical contact connection of the rear side of the semiconductor substrate is preceded by a doping step for producing a doping layer on the rear side of the semiconductor substrate. With such a step, it is possible to produce a low-impedance rear-side layer on the semiconductor substrate in a simple manner. The doping is, preferably, a $p^+$-type doping because, given a p-type basic doping of the semiconductor substrate, this means that a blocking pn junction is not produced on the rear side. The doping is, preferably, produced by a p-type implantation.

The doping layer on the rear side of the semiconductor substrate is, preferably, removed again after the production of the mesopores to avoid contamination of the front side of the semiconductor substrate by the doping material during subsequent process steps.

In accordance with yet another feature of the invention, the electrical connection of the rear side is produced by a conductive liquid that is in contact with the rear side of the semiconductor substrate. The conductive liquid is, preferably, an electrolyte and, in particular, hydrofluoric acid (HF) in an aqueous solution. Contact connection by a conductive liquid provides for a homogeneous low-impedance contact distributed over the rear side and, thus, renders the rear-side implantation step superfluous. Omitting the rear-side implantation step, in turn, obviates the application of a protective layer on the front side of the wafer before the wafer is placed onto its front side for the rear-side implantation, and also the later etching away of the doping layer on the rear side and of the protective layer on the front side after implantation. Moreover, use of an HF-containing rear-side electrolyte obviates an additional wet etching step that is necessary for removing natural silicon oxide that has formed on all uncovered silicon areas. The liquid electrolyte on the front side of the semiconductor substrate is, preferably, an aqueous HF solution that has an HF proportion of, preferably, at most 25% and, typically, of 3%.

The electrical voltage between the rear side of the semiconductor substrate and the liquid electrolyte is, preferably, configured such that the current density through the rear side of the semiconductor substrate is less than 100 $mA/cm^2$ and, preferably, less than 50 $mA/cm^2$. The current density, or the voltage that is dropped across the space charge zone and is linked to the current density, determines, together with the n-type dopant concentration at the trench walls, the mesopore density at the trench walls. The mesopore density is given by the extent of the space charge zones at the sides of the mesopores that, as passivation layer, protect a mesopore from the growth of an adjacent mesopore. Preferably, n-type doping and current density are chosen such that the thickness of the space charge zones at the sides of the mesopores is about 10 nm to 50 nm and, preferably, 10 nm to 30 nm. The minimum distance between two mesopores is given, to a good approximation, by the sum of the extents of the two space charge zones. As such, adjacent mesopores, preferably, have a minimum distance of 20 nm to 60 nm.

The mesopores of a trench, preferably, have a diameter of 2 to 5 nm after the electrochemical method. The mesopores are, preferably, expanded after they have been produced so as to have sufficient space available in the mesopores for the application of conductive and insulating layers for the fabrication of electrodes and dielectric for the trench capacitors. The expansion increases the radius and length of the mesopores, preferably, by approximately the same amount. In the fabrication of semiconductor memories, the expansion is, preferably, smaller than the space charge zone extent to avoid the situation in which, when expanded, mesopores of a first trench touch mesopores of an adjacent trench ("short circuit"). The mesopores for semiconductor memories are, preferably, expanded by up to 50 nm in their diameter.

The expansion of the mesopores can be carried out by many standard methods. By way of example, in a first preferred embodiment, the expansion can be effected by wet-chemical oxidation, e.g., using $H_2O_2$, and subsequent etching of the oxide, e.g., using hydrofluoric acid. In a second preferred embodiment, the expansion is achieved by an electrochemical method according to the prior art. However, other methods for expanding the mesopores by removal of wall area layers of the mesopores are also conceivable.

In semiconductor memories, the trenches have mesopores with lengths greater than a quarter and, preferably, greater than half, of the trench wall thickness with respect to the nearest trench. Trench wall thickness is, in this case, to be understood to mean the shortest distance between two trenches from wall to wall. By virtue of a mesopore length that is as large as possible, the surface in the trenches and mesopores becomes as large as possible. As a result, a large area is available for the application of capacitors with electrode areas that are as large as possible. The risk during the production of the mesopores that a mesopore will grow into the adjacent trench or into a mesopore of the adjacent trench, which can entail a short circuit between adjacent trench capacitors, is not manifested on account of a self-passivation process. Conversely, the self-passivation allows the mesopores to grow further in directions in which no nearest trench is disposed than would be possible in a direction towards the nearest trench. Consequently, by virtue of the self-passivation, the n-doped volume between the trenches, independently of the configuration of the trenches with respect to one another, can be utilized maximally for mesopore formation without short circuits between mesopores arising.

In this connection, self-passivation process is understood to be the effect whereby the mesopore growth in respect of length stops independently when the trench wall thickness from the mesopore, e.g., to an adjacent mesopore or to an adjacent trench or to another cavity falls below a minimum value. According to present understanding, the self-passivation is given by the thickness of the space charge zone that produces the electrical voltage in the boundary layer between liquid electrolyte and semiconductor substrate in the semiconductor substrate. Accordingly, the minimum trench wall thickness value depends principally on the doping concentration and current density. The self-passivation, thus, affords the possibility of operating the production of mesopores over a virtually unlimited period of time without giving rise to the risk of a short circuit between adjacent trenches or mesopores. As such, the volume in the semiconductor substrate below the surface of the semiconductor substrate can be maximally utilized for the production for capacitor areas that are as large as possible. In semiconductor memories, it is possible, in this way, also to utilize the volume in the semiconductor substrate below the transistors adjacent to the trench capacitors for mesopore formation and capacitor area formation. As a result, it is possible to achieve a further increase in the packing density.

In semiconductor memories, the application of the electrical voltage between the liquid electrolyte and the semiconductor substrate, preferably, lasts longer than the time given by the ratio of half the trench wall thickness with respect to the nearest trench to the average etching rate. In such a case, the average etching rate is given by the etching rate averaged over time. Because, on account of the self-passivation, there is no risk that a mesopore will produce a "short circuit" with an adjacent mesopore or adjacent trench, the period of time of the electrochemical process, which is given by the duration of the application of the electrical voltage between the liquid electrolyte and the semiconductor substrate, can be significantly longer than would be the case without self-passivation. Without self-passivation, the electrochemical process would have to be shorter than the ratio of half the trench wall thickness with respect to the nearest trench to the average etching rate to ensure that no contact is made between mesopores and adjacent trenches. In accordance with again another feature of the invention, the mesopores of adjacent trenches are produced to not touch one another.

An electrochemical process that is longer than the ratio of half the trench wall thickness with respect to the nearest trench to the average etching rate affords the advantage that the mesopores can grow further in directions in which no nearest trench is disposed to maximally utilize the existing volume for mesopore formation.

The first electrode of a trench capacitor is, preferably, given by the n-doped regions of the trench wall surface and of the surfaces of the mesopores of the trench. This simplifies the fabrication because the n-type doping of the trench and/or mesopore walls was already predetermined for mesopore production. In a first preferred embodiment, a further n-type doping step is carried out to complete the first electrode. As such, the doping concentration required to form the mesopores can be chosen independently of the doping concentration required to produce the first electrode. The n-type doping is, preferably, produced by a gas phase deposition step and/or a TEAS, tetraethyl orthosilicate (TEOS), and subsequent annealing step.

In accordance with yet a further feature of the invention, the first electrode is produced by applying a conductive layer to the n-doped regions of the trench wall regions and surfaces of the mesopores. The conductive layer is, preferably, a metal or silicide, e.g., tungsten or tungsten silicide. As such, it is possible to eliminate the space charge zone that is produced by the junction between dielectric and n-type silicon at the trench wall region and that forms a parasitic capacitance with respect to the trench capacitor.

In accordance with yet an added feature of the invention, the n-doped regions of the trench wall surfaces and of the surfaces of the mesopores are already doped so highly that a second n-type doping step need not be carried out. However, to counteract the undesirably high mesopore density as a result of the high n-type doping concentration in this case, the current density is, preferably, increased to an extent such that the desired mesopore density value is regained.

The dielectric for semiconductor memories is, preferably, an oxide-nitride-oxide (ONO) layer, a nitride-oxide (NO) layer, an aluminum oxide layer, or a zirconium oxide layer. All of these layers are process-compatible with the fabrication of trench capacitors and enable, even with a very thin layer construction, an electrical insulation between the two electrodes that has the requisite breakdown strength. For discrete trench capacitors, the dielectric is, preferably, also silicon oxide and/or nitride. Preferably, the dielectric covers the entire n-doped mesopore wall surface of the trench and the predominant part of the associated trench wall surface because a trench capacitor having the largest possible area can be produced in this way.

The second electrode for semiconductor memories is, preferably, a conductive material and, preferably, polysilicon, tungsten silicide, or another silicide. For discrete trench capacitors, the second electrode is, preferably, also aluminum. Preferably, the second electrode largely covers the dielectric layer because a trench capacitor having the largest possible area can be produced in this way. The second electrode is produced after the application of the dielectric, preferably, by filling the trenches and/or mesopores with a conductive material. As such, no cavities are produced in the trench and mesopore region, which cavities produce insulation islands as a result of chemical reactions (oxidation etc.) over the course of time and render the trench capacitor unusable. In a preferred embodiment, the conductive material is doped polysilicon and, particularly preferably, n-doped polysilicon. The polysilicon is, preferably, etched back after the filling of the trenches from the front side of the semiconductor substrate, the lower trench region still remaining filled with polysilicon.

In a first embodiment, the trench capacitors, preferably, serve as discrete capacitor devices. The mesopores make it possible to increase the capacitance of comparable trench capacitors without mesopores by a multiple.

Preferably, the semiconductor substrate is of silicon, in particular, the semiconductor substrate is provided as a p-doped silicon wafer.

In accordance with yet an additional feature of the invention, the trench capacitors having a first electrode, dielectric and second electrode, preferably, serve as storage capacitors for memory cells, the memory cells, preferably, having at least one selection transistor. The selection transistor is, preferably, connected to the second electrode. The contact connection of the trench capacitors to the respective circuit elements, in particular, to the respective selection transistor, and to the desired potentials, in particular, to a common reference-earth potential is, preferably, effected in steps of the kind customary for the fabrication of semiconductor memories and, in particular, of DRAM devices.

In accordance with again an added feature of the invention, the memory cells are memory cells for nonvolatile semiconductor memories, in particular, for ferroelectric memories. In this case, the dielectric is, preferably, a ferroelectric material, in particular, one from the group of the perovskite group and, particularly, $SrBi_2Ta_2O_9$ (SBT), $Pb(Zr,Ti)O_3$ (PZT), or $Bi_4Ti_3O_{12}$ (BTO).

In accordance with again an additional feature of the invention, an electrochemical process produces the trenches. In such a case, the trenches are also, preferably, produced by application of a voltage between the rear side of the semiconductor substrate and a liquid electrolyte applied on the front side of the semiconductor substrate. A preferred method for producing trenches by electrochemical methods is described in co-pending U.S. patent application Ser. No. 10/436,427 titled "Method for Fabricating Trench Capacitors for Large Scale Integrated Semiconductor Memories," filed on May 12, 2003, which is hereby incorporated herein by reference).

In accordance with still another feature of the invention, the electrical contact connection of the rear side for the electrochemical method for the production of the trenches and of the mesopores is carried out in the same electrochemical chamber if the trenches are, likewise, produced by an electrochemical process (macropores). Preferably, the production of the trenches and mesopores is, then, also carried out only with a rear contact-connection step for producing an electrical connection between the voltage source and the rear side of the semiconductor substrate. A number of processing steps are obviated in this way. A detailed description of such a contact connection method is described in European Patent No. 0 400 387 B1, corresponding to U.S. Pat. No. 5,209,833 to Föll et al.

With the objects of the invention in view, there is also provided a semiconductor device, including a semiconductor substrate having a front side and memory cells of DRAM devices or ferroelectric semiconductor memories, trench capacitors at the front side of the semiconductor substrate, the trench capacitors being storage capacitors for the memory cells, each of the trench capacitors having at least one trench in the semiconductor substrate, the trench having a trench wall with an n-doped region and mesopores in the n-doped region with mesopore walls, the mesopores of adjacent ones of the trenches not touching one another, the trench wall and the mesopore walls having a first electrode, a dielectric applied on the first electrode, and a second electrode applied on the dielectric.

Other features that are considered as characteristic for the invention are set forth in the appended claims.

Although the invention is illustrated and described herein as embodied in a method for fabricating trench capacitors and a semiconductor device with trench capacitors, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIGS. 2A to 2D are fragmentary, cross-sectional views of various process steps in fabricating a trench capacitor for a semiconductor memory according to the prior art;

FIGS. 3A to 3I are fragmentary, cross-sectional view of various process steps for fabricating a configuration of trench capacitors for a semiconductor memory according to the invention;

FIG. 4 is a plan view of a diagrammatic illustration of a first configuration according to the invention of trench capacitors with mesopores for semiconductor memories.

DESCRIPTION OF THE PREFERRED EMBODIMENTS

Figure 1:
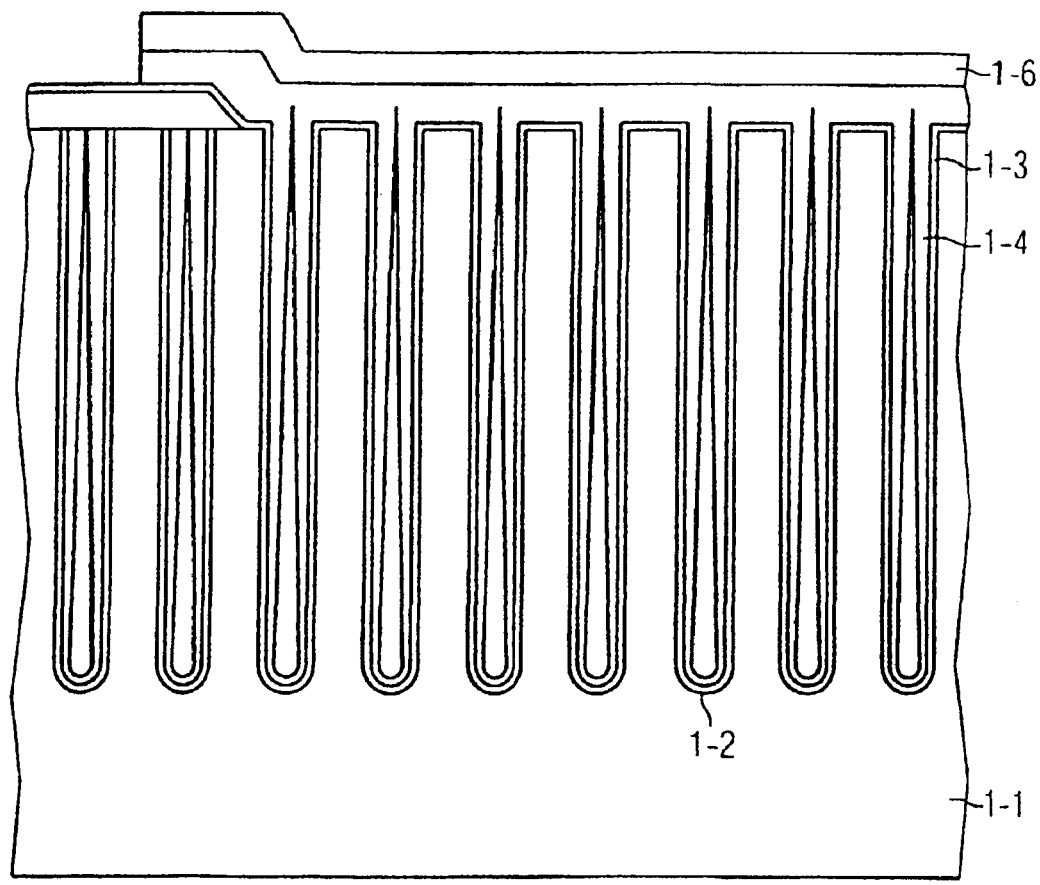
FIG. 1 is a fragmentary cross-sectional view of a discrete trench capacitor according to the prior art.
Figure 2D:
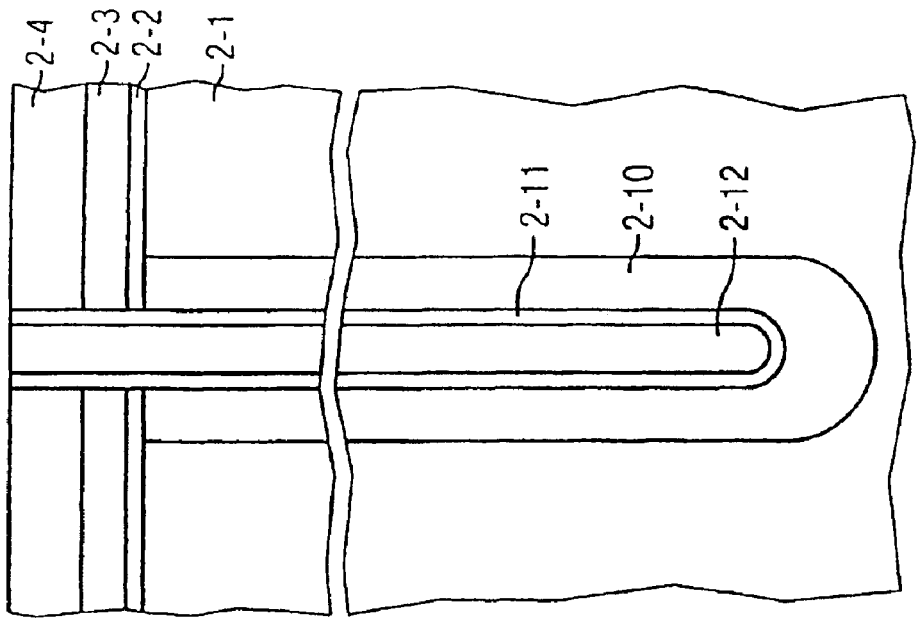
Figure 2C:
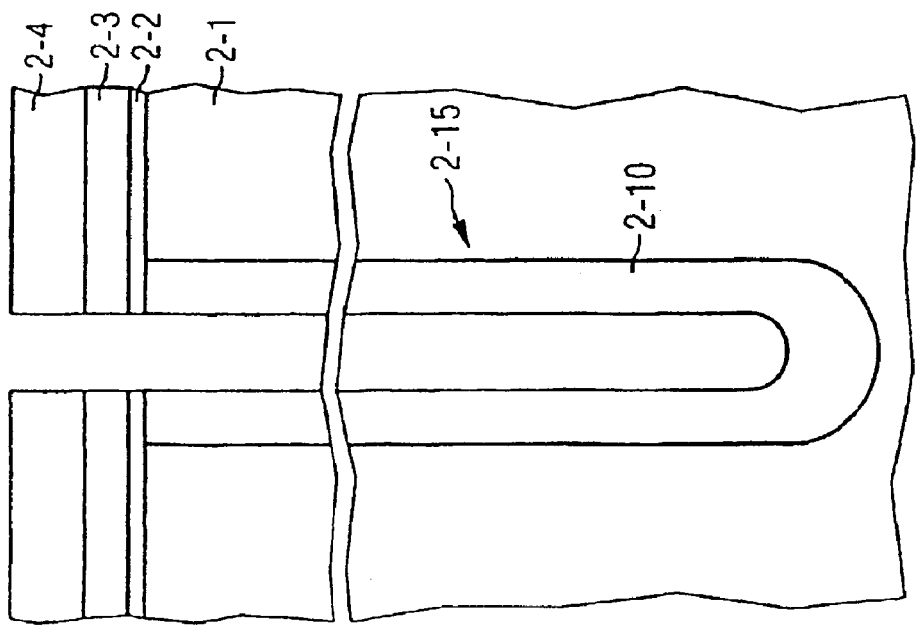

Referring now to the figures of the drawings in detail and first, particularly to FIGS. 3A to 3I thereof, there is shown, in a diagrammatic illustration, the method according to the invention for producing trench capacitors on the front side of a p-doped silicon wafer. The method is, preferably, part of a sequence of process steps for the fabrication of semiconductor memories and, preferably, DRAM semiconductor memories. In this case, unless expressly stated otherwise, dimensions and scales of the FIGS. illustrated are to be understood as not true to scale.

FIG. 3A shows a p-doped silicon wafer 3-1 having a basic doping of about $3 \times 10^{15}$ $1/cm^3$. The preferred crystal orientation of the silicon wafer is <100>. The silicon wafer 3-1 has applied to it, firstly, a thin oxide layer, which is, preferably, a thin pad oxide 3-2, a nitride layer 3-3, and a BSG layer 3-4, which serve as a mask material for the mask for producing the trenches for the trench capacitors. The pad oxide 3-2 and nitride layer 3-3 are, usually, also produced on the rear side of the silicon wafer 3-1 during the fabrication methods.

In one advantageous embodiment, there, then, follows a rear-side implantation through the pad oxide 3-2 and the nitride layer 3-3 with a p-type implant 3-5, which provides for a low-impedance and uniform p-type implantation layer 3-6 for rear-side contact connection for the later electrochemical process for the production of the mesopores. A typical implantation dose for the rear-side implantation using boron is $10^{16}$ $1/cm^2$ at an energy of about 120 keV. This method step is shown in FIG. 3A.

In the next step, the BSG layer 3-4, the nitride layer 3-3, the pad oxide 3-2 and, possibly, further overlying layers are patterned for producing trenches. The trenches 3-9 are, then, produced by an anisotropic dry etching step, preferably, using the RIE etching method (FIG. 3B). In such an embodiment, the trenches, individually identified by 3-9a, 3-9b, and 3-9c in FIG. 3B, have a diameter of, preferably, 200 nm or less and a depth of, preferably, about 10 μm. The minimum distance between two nearest trenches 3-9 is about 200 nm in this embodiment. A minimum trench wall thickness 3-8 of about 200 nm follows therefrom. Depending on the configuration of the trenches, however, the trench wall thickness 3-8 may be a number of times larger in the directions towards other adjacent trenches. Therefore, the mesopores to be produced may be significantly longer in these directions.

FIG. 3B, likewise, reveals the TEAS/TEOS oxide layer 3-10 produced by a TEAS/TEOS step, which layer is applied to the silicon wafer 3-1 after the production of the trenches 3-9 by a low-pressure chemical vapor deposition method (LPCVD). In such an embodiment, the layer produced by the TEAS step, preferably, has a planar thickness of about 15 nm and the overlying layer produced by a TEOS step, preferably, has a planar thickness of about 10 nm. In particular, the TEAS/TEOS oxide layer 3-10 covers the trench wall surface 3-11. The arsenic from the TEAS/TEOS oxide layer 3-10 is required for the n-type doping of the trench wall surface 3-11 with arsenic that is to be carried out later.

FIG. 3C diagrammatically shows the silicon wafer 3-1 after the trenches 3-9 have been filled with polysilicon 3-14 and etched back again at the upper trench edge, by at least 500 nm and, preferably, by about 1500 nm from the upper edge of the trenches, preferably, in a dry-chemical etching step. Afterwards, the TEAS/TEOS oxide layer 3-10 is etched wet-chemically. As a result, it remains only in the lower part of the trenches. This results in the conspicuous structure shown in FIG. 3C, in which the etched-back polysilicon 3-14 in the trenches 3-9 projects above the etched-back TEAS/TEOS oxide layer 3-10, preferably, by about 100 nm. The etched-back polysilicon 3-14 serves as an auxiliary structure for producing a lateral electrically insulating covering layer of the trench wall surfaces 3-11.

The etching-back of the polysilicon 3-14 and of the TEAS/TEOS oxide layer 3-10 in the trench 3-9 defines a division of the trench 3-9 in two, into an upper trench region 3-12, at whose trench wall region no mesopores are produced later, and into a lower trench region 3-13, at whose trench wall region mesopores are produced. The suppression of mesopore formation in the upper trench region 3-12 prevents, inter alia, mesopores from being produced too close to the surface of the silicon wafer 3-1 and, thereby, impairing the functioning of adjacent structures at the surface of the silicon wafer 3-1, e.g., of a selection transistor. Furthermore, as a result of etching-back of the TEAS/TEOS oxide layer 3-10, the n-type doping required for the mesopores takes place only in the lower trench region 3-13. The upper trench region 3-12 is, preferably, also required for this, in order to provide space for an oxide collar that is usually required for trench capacitors having a common first electrode ("buried-plate trench capacitors").

FIG. 3D shows the structure after the application of a second electrically insulating covering layer 3-15a, which supplies the material for the vertical electrically insulating covering layers to be produced. The second electrically insulating covering layer 3-15a is, preferably, made of nitride. On account of the partial filling of the trenches 3-9 with polysilicon 3-14 and TEAS/TEOS oxide layer 3-10, the second electrically insulating covering layer 3-15a can only cover the trench wall surface of the upper trench region 3-12. In this embodiment, the layer thickness of the second electrically insulating covering layer 3-15a is, typically, 20 nm.

After the process of covering with the second covering layer 3-15a, an annealing step is, preferably, carried out, by which the arsenic of the TEAS/TEOS oxide layer 3-10 that has remained on the trench wall diffuses into the trench wall of the lower trench regions 3-13 and is activated. As such, the trench walls of the lower trench regions 3-13 are n-doped. The arsenic diffusion is, preferably, carried out to a depth and with a dose that suffices for the silicon between adjacent trenches 3-9 to be completely n-doped, thereby forming an n-doped layer 3-17 in the trench region. A preferred n-type doping concentration is in the region of $1 \times 10^{19}$ 1/cm$^3$. In this way, the entire region between the walls of adjacent trenches is made available as volume for the growth of mesopores. Thus, with the aid of the mesopores, for each trench 3-9, the available volume can be maximally utilized for gaining surface area and, hence, gaining electrode area.

FIG. 3E shows the structure after the following steps. Firstly, the horizontally running regions of the second electrically insulating covering layer 3-15a are removed by an anisotropic etching step, with the result that only the vertical electrically insulating covering layers 3-15 remain on the trench wall surfaces in the upper trench regions 3-12. The vertical electrically insulating covering layers 3-15 serve for suppressing mesopore formation in the upper trench region 3-12 and for suppressing a harmful short-circuit current between the liquid electrolyte and p-doped regions in the upper trench region. The polysilicon 3-14 and the remaining portion of the TEAS/TEOS oxide layer 3-10 are, then, removed from the trenches.

After the p-type implantation layer 3-6 on the rear side of the silicon wafer 3-1 has been uncovered in etching step, the electrochemical method for producing the mesopores can be carried out. To that end, after an HF dip, preferably, in an electrochemical chamber 3-20, the silicon wafer 3-1 is placed by its rear side onto a conductive contact layer 3-21 and, if appropriate, pressed on there, thereby producing an electrical contact between the silicon wafer 3-1 and the conductive contact layer 3-21. An embodiment of the electrochemical chamber 3-20 is illustrated diagrammatically in FIG. 3F. The conductive contact layer 3-21 serves for the electrically conductive connection between the substrate holder 3-22 and the silicon wafer 3-1 so that the rear side of the silicon wafer 3-1 can be put at a defined potential.

Furthermore, an etching cup 3-23 is, preferably, placed on the silicon wafer 3-1 and is sealed in a watertight manner with the silicon wafer 3-1 by an O-ring 3-28. The liquid electrolyte 3-24 is filled into the etching cup 3-23, which electrolyte, thus, preferably, covers only the front side of the silicon wafer 3-1 and fills the trenches on the front side of the silicon wafer 3-1. The counter-electrode 3-25 is immersed in the liquid electrolyte 3-24; that surface of the counter-electrode that is directed towards the silicon wafer 3-1 is largely coplanar with respect to the silicon wafer 3-1; and the counter-electrode 3-25 largely covers the region of the trench capacitors on the silicon wafer 3-1. This provides for a homogeneous current density in the region of the rear side of the silicon wafer 3-1, the current direction, preferably, running largely perpendicularly to the rear side of the silicon wafer 3-1. The voltage required for the current flow is provided by a voltage source 3-26 between the counter-electrode 3-25 and the substrate holder 3-22. The voltage on the counter-electrode 3-25 is, preferably, negative with regard to the substrate holder 3-22. The voltage is set to a value for which the current density in the region of the rear side of the silicon wafer 3-1 lies in the region of 1 to 100 mA/cm$^2$. The current and, hence, the average current density are measured using a current measuring device 3-27. A preferred detailed embodiment of the electrochemical chamber is described in co-pending U.S. patent application Ser. No. 09/871,013 entitled "Method For Making Electrical Contact With A Rear Side Of A Semiconductor Substrate During Its Processing" filed May 31, 2001, which is incorporated herein by reference.

The liquid electrolyte used is, preferably, an aqueous HF solution that has an HF proportion of, preferably, at most 25% and, preferably, 3%. Depending on the electrolyte, too, the average etching rate is approximately 60 nm/min. The duration of this electrochemical process is, preferably, about 5 minutes. It, thus, lasts about 3 times longer than the time given by the ratio of half the trench wall thickness with respect to the nearest trench 3-8 to the average etching rate. As such, it is possible to produce mesopores having a length that is about 1.5 times as long as the trench wall thickness with respect to the nearest trench. However, these long mesopores can only grow in directions in which no nearest trench is disposed. In this way, the regions between adjacent trenches are also utilized for forming mesopores.

FIG. 3G diagrammatically shows the trench configuration after the electrochemical method. Depending on the current density and doping, the etched mesopores 3-30 have a diameter of between 2 and 20 nm and, preferably, between 2 and 10 nm. Their maximum length is given by the length of the electrochemical method. In this embodiment, it is approximately 1.5 times as long as the trench wall thickness with respect to the nearest trench, that is to say about 300 nm. However, the self-passivation prevents the mesopores from reaching the full length if, beforehand, the mesopore grows nearer to another mesopore or trench than about twice the space charge zone thickness. Because the space charge zone at the sides of the mesopores is about 10–30 nm in this embodiment, a minimum distance 3-41 between two mesopores of about 20–60 nm is, thus, defined. See FIG. 4. The minimum distance that may separate adjacent mesopores is given substantially by the current density of between 1 and 100 mA/cm$^2$ and the n-type doping concentration of about $10^{19}$ 1/cm$^3$.

After the electrochemical etching of the mesopores, in order to prevent contamination of the front side of the silicon wafer 3-1 by the possibly highly doped rear side, the p-type implantation layer 3-6 on the rear side is, preferably, removed by single-sided etching.

To facilitate the introduction of a dielectric layer and of a second electrode layer into the mesopores 3-30 for the fabrication of capacitors, the mesopores 3-30 are, preferably, expanded. However, the expansion must be significantly smaller than the minimum distance between two mesopores, which is given by the space charge zone, in order to ensure that the expansion does not lead to "short circuits" between adjacent mesopores of adjacent trenches. In the present embodiment, the expanded mesopores 3-30a, at each side, are expanded, preferably, by about 10 nm to 20 nm, with the result that the diameter of the expanded mesopores 3-30a grows to about 25 nm to 50 nm. The length of the expanded mesopores 3-30a also correspondingly increases by 10 nm to 20 nm.

The expansion in this embodiment of the method according to the invention is, preferably, effected by oxidation of the trench surfaces and of the surfaces of the mesopores 3-30 and subsequent etching of the oxide, e.g., using hydrofluoric acid. The oxidation can be carried out by a plurality of methods according to the prior art. In this embodiment, the oxidation was performed wet-chemically using $H_2O_2$, HF, and $H_2O$.

Figure 3F:
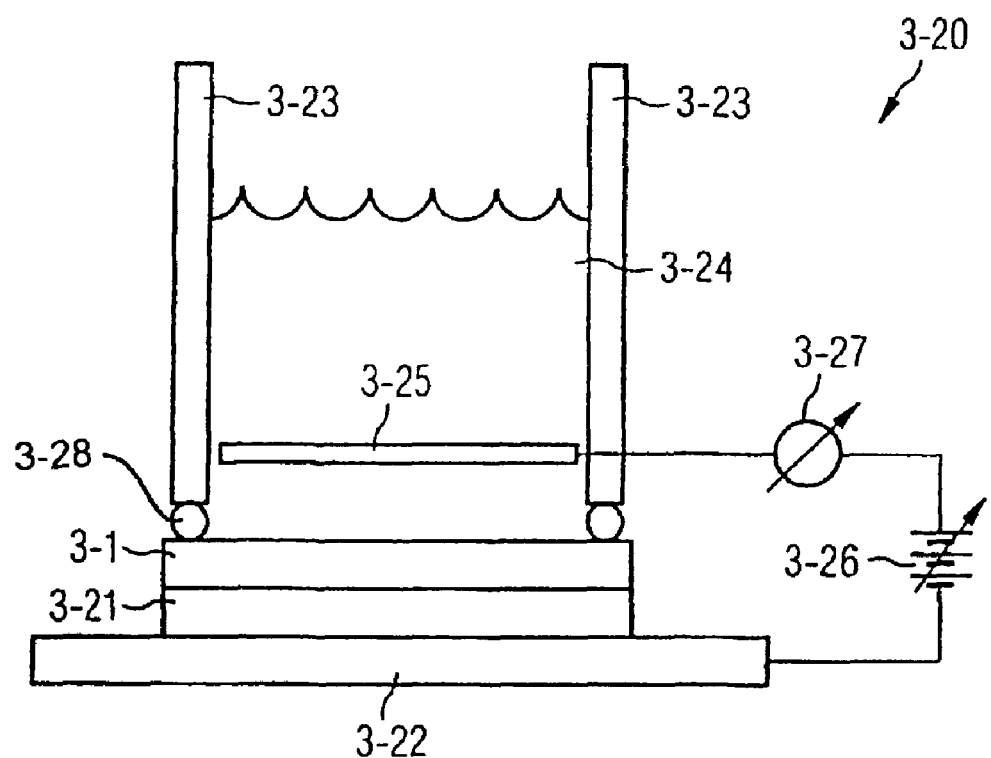
Figure 3H:
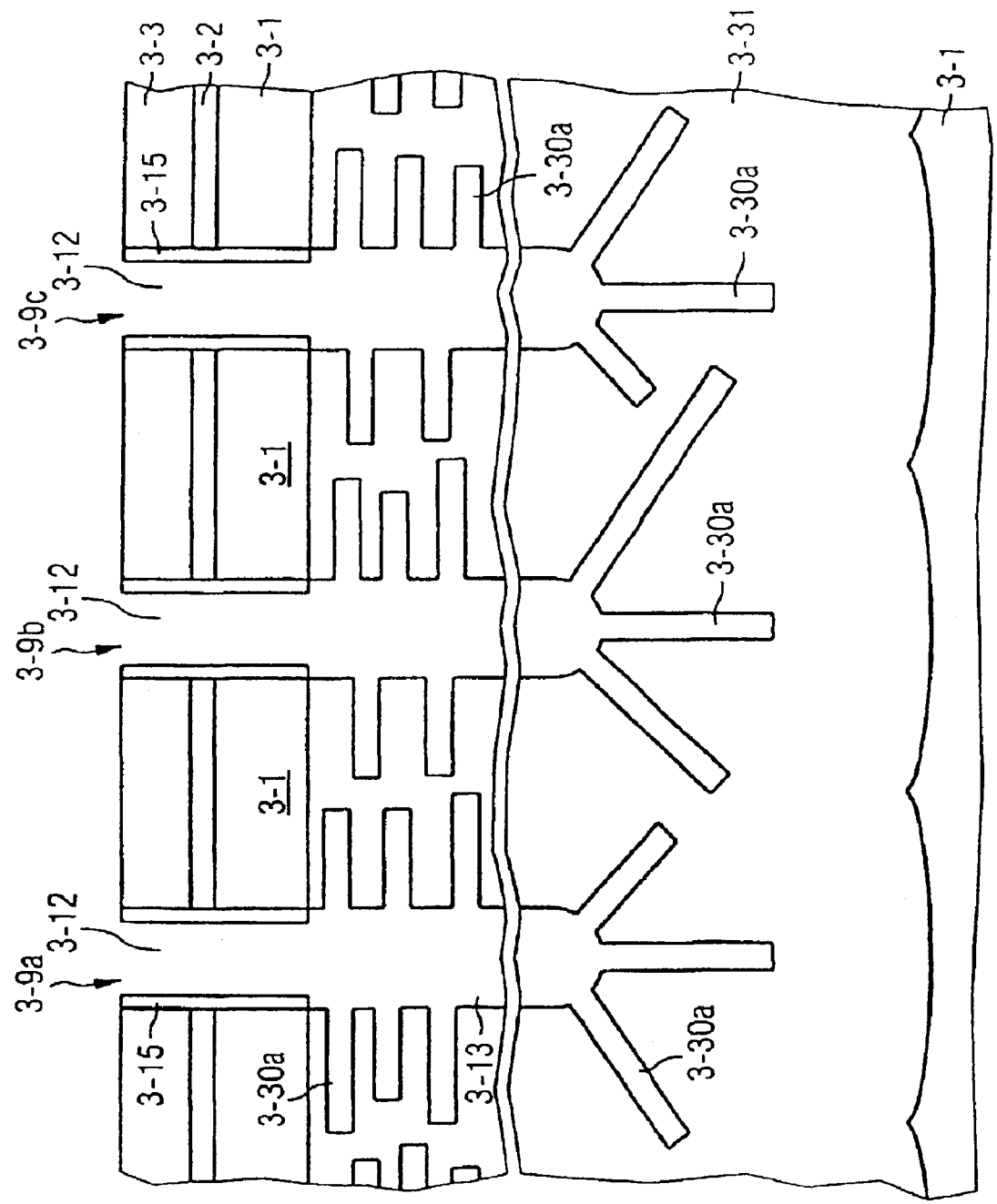

FIG. 3H diagrammatically shows the structure after the mesopores have been expanded in respect of their diameter and length by an oxidation and oxidation etching step. What is not shown in the following figures is that the mesopores grow in a woodworm-hole-like manner, i.e., that they change direction during the growth process and can, thus, have a curved profile. The mesopores may, furthermore, be of different lengths and have a varying diameter.

On account of the self-passivation, the mesopores 3-30 of adjacent trenches 3-9 do not touch one another, but, rather, are at a minimum distance from one another. Although the minimum distance between two mesopores is reduced by the expansion it is nonetheless sufficient as long as the expansion of the mesopores is less than the space charge zone thickness that passivates the mesopores.

Moreover, FIG. 3H shows an additional buried n-doped layer 331, which has been produced by a second doping step for increasing the n-type doping in the lower trench region 3-13. The second n-type doping is, preferably, effected by gas phase deposition doping or, as an alternative, by a further TEAS/TEOS coating step and a subsequent annealing process that guides in and activates the n-type doping material at the open silicon, i.e. in particular at the trench walls 3-9 of the lower trench regions 3-13 and at the walls of the expanded mesopores 3-30a. The, thus, highly n-doped layer, preferably, forms in the region of the trenches 3-9 a buried n-doped layer 3-31, which, on one hand, preferably, constitutes the first electrode layer of the trench capacitors and, on the other hand, preferably, constitutes a low-impedance connection between the first electrodes of adjacent trenches, with the result that the first electrodes are at a common potential. A "buried plate" has advantageously been produced in this way.

Figure 3I:
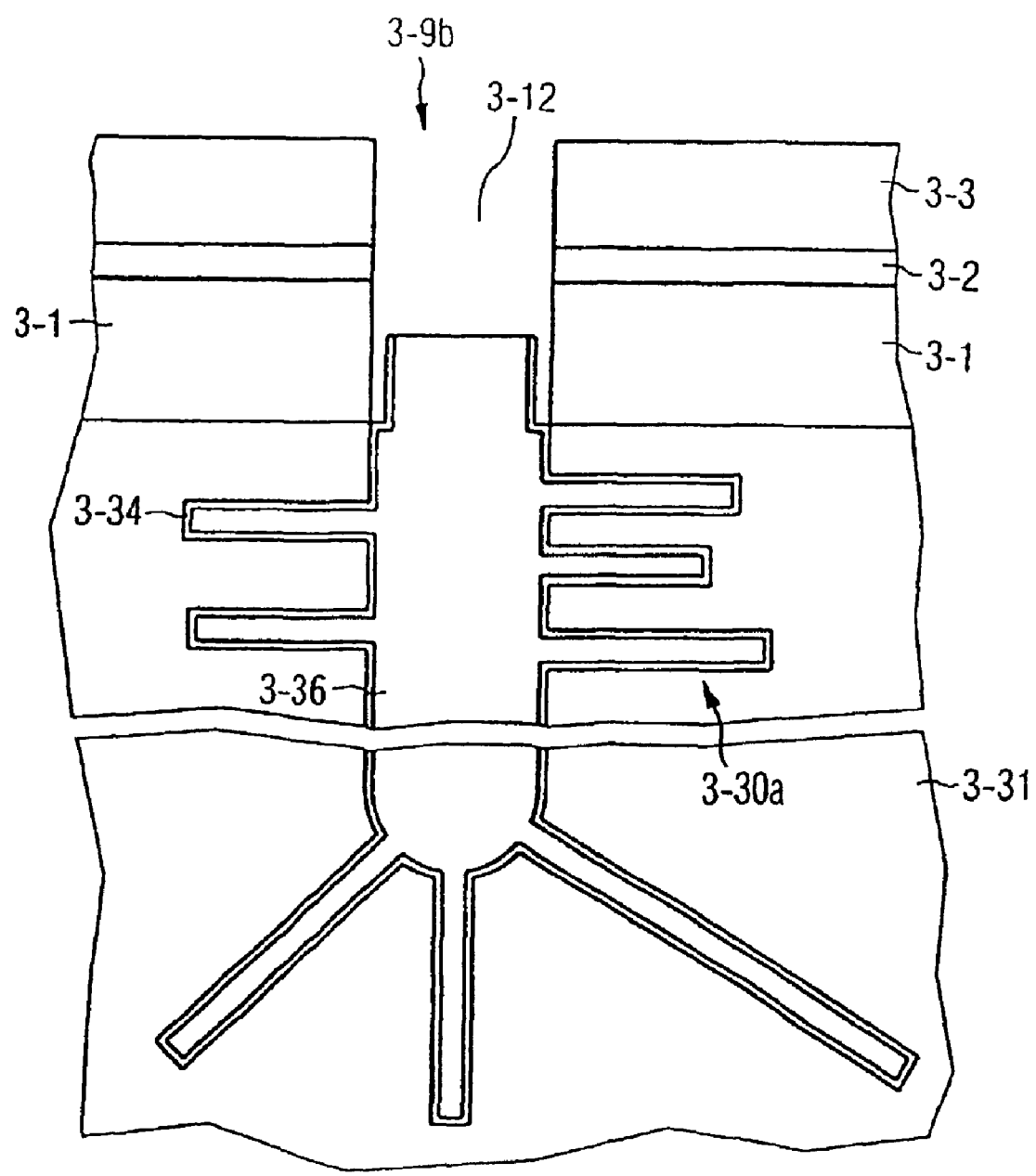

The following steps are prior art and are shown diagrammatically in FIG. 3I. They include the deposition of a nitride layer and the production of an oxide layer, which, as NO layer, together forms a thin dielectric layer 3-34 on the surfaces of the trenches 3-9 and expanded mesopores 3-30a. An n-doped polysilicon filling is, subsequently, introduced as second electrode 3-36 of the storage capacitor to the dielectric layers 3-34 into the trenches and mesopores, the polysilicon of the second electrode 3-36, preferably, being etched back again by about 1300 nm to provide space there for the insulation of the trench covers. Afterwards, the dielectric layer 3-34 and the vertical electrically insulating covering layer 3-15 are removed again by hydrofluoric acid as far as the polysilicon.

The further steps relate, in particular, to the contact connections of the buried n-doped layer 3-31 and of the second electrodes 3-36 of the trench capacitors to, e.g., selection transistors and DC voltage potentials. These steps can be carried out by methods according to the prior art and are not described any further here.

FIG. 4 shows a first diagrammatic illustration of an embodiment according to the invention of trench capacitors 3-40 for semiconductor memories as a plan view of the surface of a silicon wafer 3-1.

The trench capacitors 3-40 in FIG. 4 are disposed in a regular two-dimensional structure with a distance A1 in a first direction and a distance A2 in a second direction, the two directions being largely perpendicular to one another in the present case. The second electrode 3-36 and the dielectric layer 3-34, which are, respectively, disposed in the trench 39 of the trench capacitor 3-40, are depicted for each trench capacitor 3-40 in FIG. 4. The expanded mesopores 3-30a, which are oriented largely radially away from the trench walls and have been expanded by oxidation and subsequent oxide etching, are depicted diagrammatically. In reality, the expanded mesopores 3-30a are not visible because they are situated below the surface of the silicon wafer 3-1. The expanded mesopores 3-30a serve for increasing the total surface area of a trench 3-9. The dielectric layer 3-34 and second electrode 3-36 are not depicted in the mesopores for space reasons. In this preferred embodiment, the first electrodes are given by the buried n-doped layer that, likewise, lies below the surface of the silicon wafer and is not illustrated in FIG. 4.

The expanded mesopores 3-30a of a trench 3-9 have different lengths on account of the self-passivation of the mesopores during the growth of the mesopores. The self-passivation commences as soon as the minimum distance between two mesopores 3-41 (or from a trench) is reached. Therefore, the mesopores are particularly long in the directions in which an adjacent trench is further away.

By choosing a long time duration for the electrochemical process, the mesopores grow, preferably, up to the point at which other mesopores have already formed. As such, regions of the volume between the trenches that could not be reached otherwise, e.g., in the case of radial extension of the trenches for the purpose of increasing the surface areas, can also be utilized for mesopore formation. Furthermore, there is no risk of "short circuits" between mesopores forming in the event of minimum distances between mesopores of different trenches not being observed because the self-passivation not only prevents two mesopores from touching, but also even guarantees a safety distance. Therefore, on account of the properties of self-passivation, the available silicon volume between the trenches can be utilized optimally for forming a surface that is as large as possible for electrodes.

Figure 5:
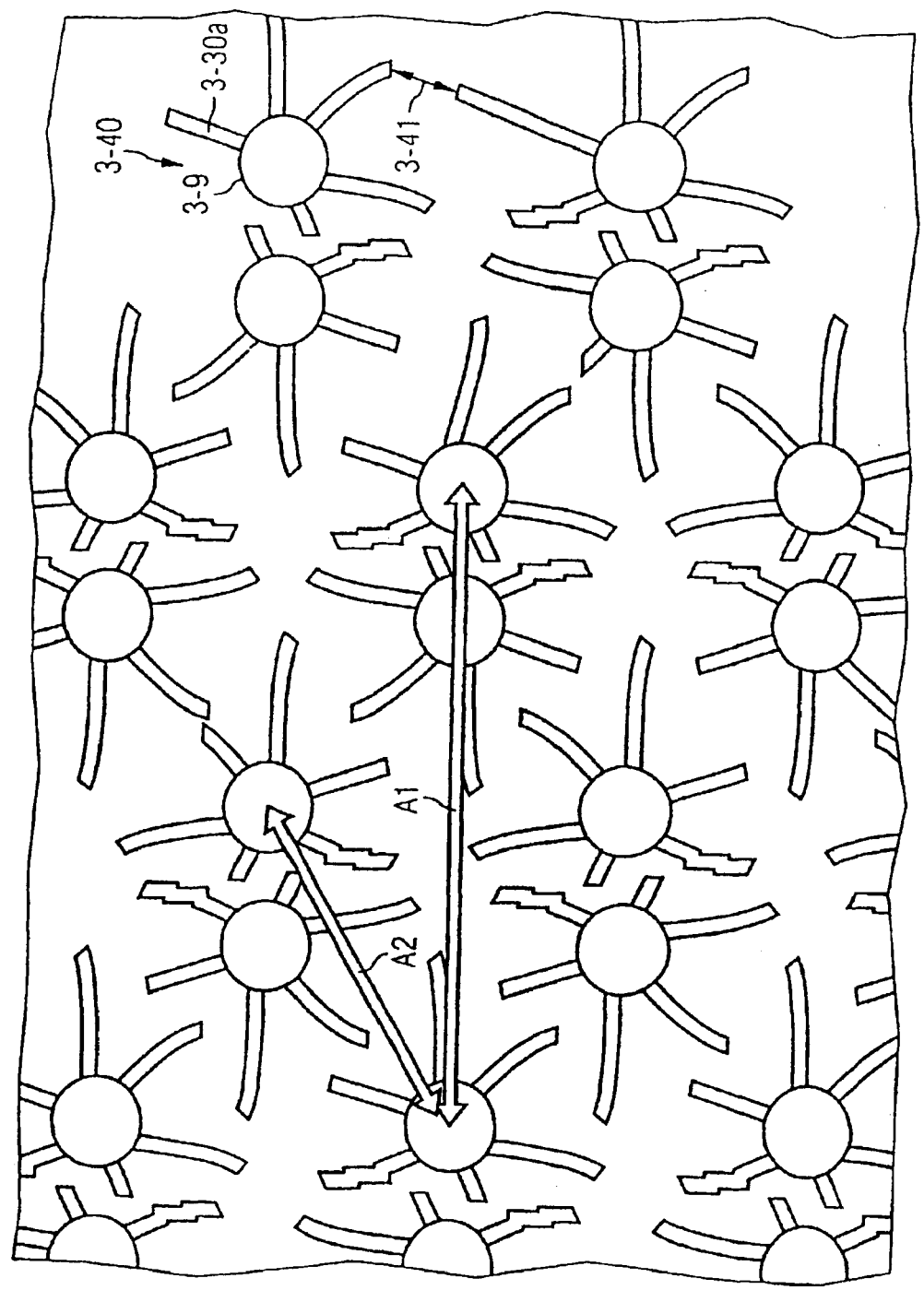
FIG. 5 is a plan view of a diagrammatic illustration of a second configuration according to the invention of trench capacitors with mesopores for semiconductor memories.

FIG. 5 shows another preferred embodiment of the trench capacitors according to the invention. It differs from the embodiment of FIG. 4 primarily by the configuration of the trenches 3-9 for the trench capacitors 3-40. In this preferred embodiment, the trenches 3-9 are disposed as trench pairs such that they are at a regular distance A1 in one direction and a regular distance A2 in the other direction A2. As a result of the configuration of closely adjacent pairs, concentric expansion of the trenches 3-9 for the purpose of increasing the trench wall surface areas would be possible only to a small extent because, otherwise, there is the risk of the trench pairs touching one another. A large part of the volume between the trenches would be unutilized.

However, on account of the invention's self-passivating growth of mesopores 3-9, it is possible, with the aid of the mesopores, to produce trench surfaces even in the more remote regions of the trenches, without forming "short circuits" with the nearest trench-pair partner. As such, the volume of the semiconductor substrate between the trenches can be effectively utilized for the highest possible capacitance of the trench capacitor surfaces.

We claim:

1. A method for fabricating at least one trench capacitor, which comprises:
   providing a semiconductor substrate having at least one trench on a front side thereof, the at least one trench having a trench wall with a trench wall surface and a predetermined n-type doping at the trench wall surface;
   applying a liquid electrolyte to the front side of the semiconductor substrate;
   applying an electrical voltage between a rear side of the semiconductor substrate and the liquid electrolyte to cause an electric current having a predetermined current density of less than 50 mA/cm$^2$ to flow and produce mesopores in the trench wall, the n-type doping and the current density being chosen to provide a thickness of space charge zones at sides of the mesopores to be approximately 10 to 50 nm;
   producing a first electrode in the at least one trench and the associated mesopores;
   applying a dielectric to the first electrode; and
   applying a second electrode to the dielectric.

2. The method according to claim 1, which further comprises providing the semiconductor substrate with trenches.

3. The method according to claim 2, which further comprises disposing the trenches in a regular two-dimensional structure.

4. The method according to claim 2, which further comprises providing the trenches with substantially the same form.

5. The method according to claim 2, which further comprises providing the trenches with a cross-section, as seen from a surface of the semiconductor substrate, that is oval or substantially round.

6. The method according to claim 5, which further comprises providing the trenches to be more than ten times as deep as a maximum cross-section of a respective trench at the surface of the semiconductor substrate.

7. The method according to claim 6, which further comprises covering the surface of the semiconductor substrate with a horizontal electrically insulating covering layer in regions between the trenches during the applied electrical voltage.

8. The method according to claim 7, wherein the horizontal electrically insulating covering layer is of nitride.

9. The method according to claim 7, which further comprises:
   providing the trenches respectively with an upper trench region and a lower trench region;
   covering the trench wall surfaces of the upper trench regions with vertical electrically insulating covering layers during the applied electrical voltage; and
   keeping the trench wall surfaces of the lower trench region free of electrically insulating covering layers during the applied electrical voltage.

10. The method according to claim 9, wherein the vertical electrically insulating covering layers are of nitride.

11. The method according to claim 9, which further comprises doping the trench walls of the lower trench regions as n-doped.

12. The method according to claim 11, which further comprises selecting the doping of the trench walls of the lower trench regions and the current density to produce a predetermined average mesopore density.

13. The method according to claim 2, which further comprises producing the trenches with mesopores having a length greater than a quarter of the trench wall thickness with respect to a nearest trench.

14. The method according to claim 2, which further comprises producing the trenches with mesopores having a length greater than half of the trench wall thickness with respect to a nearest trench.

15. The method according to claim 2, which further comprises applying the electrical voltage between the liquid electrolyte and the semiconductor substrate to last longer than a time given by the ratio of half the trench wall thickness with respect to the nearest trench to the average etching rate.

16. The method according to claim 2, which further comprises producing the mesopores of adjacent trenches to not touch one another.

17. The method according to claim 2, which further comprises providing the trenches as trench capacitors that are storage capacitors for memory cells.

18. The method according to claim 17, which further comprises providing the trenches to be storage capacitors for memory cells of DRAM devices or of ferroelectric semiconductor memories.

19. The method according to claim 2, which further comprises producing the trenches with an electrochemical process.

20. The method according to claim 19, which further comprises carrying out the electrical contact connection of the rear side for the electrochemical process for the production of the trenches and of the mesopores in the same electrochemical chamber.

21. The method according to claim 1, which further comprises producing the predetermined current density with an electrical voltage between the rear side of the semiconductor substrate and a counter-electrode introduced in the liquid electrolyte.

22. The method according to claim 21, which further comprises preceding the electrical contact connection of the rear side of the semiconductor substrate with a doping step producing a doping layer on the rear side of the semiconductor substrate.

23. The method according to claim 22, which further comprises removing the doping layer on the rear side of the semiconductor substrate after the production of the mesopores.

24. The method according to claim 1, which further comprises providing the liquid electrolyte as an aqueous HF solution having an HF proportion of at most 25%.

25. The method according to claim 1, which further comprises widening the mesopores before the dielectric is applied.

26. The method according to claim 1, which further comprises producing the mesopores of a trench with an average mesopore diameter greater than 5 nm.

27. The method according to claim 1, which further comprises producing the mesopores of a trench with an average mesopore diameter less than 50 nm.

28. The method according to claim 1, which further comprises producing the mesopores of a trench with an average mesopore diameter greater than approximately 5 nm and less than approximately 50 nm.

29. The method according to claim 1, which further comprises providing the first electrode of a trench capacitor by n-doped regions of the trench wall surface and of surfaces of the mesopores of the trench.

30. The method according to claim 29, which further comprises carrying out an n-type doping step to complete the first electrode of a trench capacitor.

31. The method according to claim 1, which further comprises providing the dielectric of the trench capacitor to be an oxide-nitride-oxide layer, a nitride-oxide layer, an aluminum oxide layer, or a zirconium oxide layer.

32. The method according to claim 1, which further comprises providing the second electrode of a trench capacitor as polysilicon or tungsten silicite.

33. The method according to claim 1, which further comprises providing the semiconductor substrate as a p-doped silicon wafer.

* * * * *